(12) United States Patent
Kawano et al.

(10) Patent No.: US 10,700,245 B2
(45) Date of Patent: Jun. 30, 2020

(54) LIGHT-EMITTING DEVICE

(71) Applicant: NICHIA CORPORATION, Anan-shi (JP)

(72) Inventors: Yusuke Kawano, Anan (JP); Shunsuke Miyajima, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/027,201

(22) Filed: Jul. 3, 2018

(65) Prior Publication Data

US 2019/0013447 A1 Jan. 10, 2019

(30) Foreign Application Priority Data

Jul. 4, 2017 (JP) .................................. 2017-131056
May 18, 2018 (JP) .................................. 2018-096537

(51) Int. Cl.
| | |
|---|---|
| *H01L 33/50* | (2010.01) |
| *H01L 25/075* | (2006.01) |
| *H01L 33/56* | (2010.01) |
| *H01L 33/60* | (2010.01) |
| *H01L 33/62* | (2010.01) |

(52) U.S. Cl.
CPC ........ *H01L 33/504* (2013.01); *H01L 25/0753* (2013.01); *H01L 33/507* (2013.01); *H01L 33/56* (2013.01); *H01L 33/60* (2013.01); *H01L 33/505* (2013.01); *H01L 33/62* (2013.01)

(58) Field of Classification Search
CPC ..... H01L 27/15; H01L 27/153; H01L 27/156; H01L 33/486; H01L 33/50; H01L 33/507; H01L 33/508
See application file for complete search history.

(56) References Cited

U.S. PATENT DOCUMENTS

| | | |
|---|---|---|
| 2011/0210311 A1 | 9/2011 | Kim et al. |
| 2011/0210351 A1 | 9/2011 | Kim et al. |
| 2011/0309388 A1 | 12/2011 | Ito et al. |
| 2012/0140506 A1 | 6/2012 | Waragawa et al. |
| (Continued) | | |

FOREIGN PATENT DOCUMENTS

| | | |
|---|---|---|
| JP | 2009-111140 A | 5/2009 |
| JP | 2011-181921 A | 9/2011 |
| (Continued) | | |

*Primary Examiner* — Jae Lee
(74) *Attorney, Agent, or Firm* — Mori & Ward, LLP

(57) ABSTRACT

A light-emitting device comprising: a base member; a plurality of first light-emitting elements disposed on the base member; a plurality of second light-emitting elements disposed on the base member; a plurality of first wavelength conversion members; and a second wavelength conversion member. The first wavelength conversion members are respectively disposed on or above the first light-emitting elements. The first wavelength conversion members each comprises a light-transmissive body mainly containing an inorganic material, and a first phosphor layer on the lower surface of the light-transmissive body. The second wavelength conversion member is disposed on the base member to cover the second light-emitting elements and the first wavelength conversion members. The second wavelength conversion member comprises an encapsulating resin and second phosphor.

20 Claims, 5 Drawing Sheets

(56) References Cited

U.S. PATENT DOCUMENTS

| | | |
|---|---|---|
| 2012/0236582 A1 | 9/2012 | Waragaya et al. |
| 2013/0033169 A1 | 2/2013 | Ito et al. |
| 2014/0070244 A1 | 3/2014 | Kim et al. |
| 2014/0146547 A1* | 5/2014 | Tsutsumi ............... H01L 33/46 362/343 |
| 2014/0203306 A1 | 7/2014 | Ito |
| 2016/0020369 A1 | 1/2016 | Ukawa |
| 2016/0161067 A1* | 6/2016 | Oepts ............... H01L 25/0753 362/84 |
| 2016/0190414 A1 | 6/2016 | Miyamoto |
| 2016/0247987 A1 | 8/2016 | Ito |
| 2016/0284950 A1 | 9/2016 | Tseng |
| 2017/0033267 A1 | 2/2017 | Tamaki et al. |
| 2017/0092825 A1* | 3/2017 | Bando ............... H01L 33/38 |
| 2017/0111972 A1 | 4/2017 | Oepts et al. |
| 2017/0133559 A1 | 5/2017 | Basin et al. |
| 2017/0196060 A1* | 7/2017 | Watanabe ........... H01L 25/0753 |
| 2017/0207203 A1* | 7/2017 | Kawano ............. H01L 25/0753 |
| 2017/0278829 A1 | 9/2017 | Stoll et al. |
| 2018/0331261 A1 | 11/2018 | Basin et al. |

FOREIGN PATENT DOCUMENTS

| | | |
|---|---|---|
| JP | 2012-004303 | 1/2012 |
| JP | 2013-038187 A | 2/2013 |
| JP | 2013-077679 A | 4/2013 |
| JP | 2013-120812 | 6/2013 |
| JP | 2013-182918 | 9/2013 |
| JP | 2014-143300 | 8/2014 |
| JP | 2015-126209 | 7/2015 |
| JP | 2016-029720 | 3/2016 |
| JP | 2016-127281 | 7/2016 |
| JP | 2016-531432 | 10/2016 |
| JP | 2017-033967 A | 2/2017 |
| JP | 2017-523600 | 8/2017 |
| JP | 2017-531315 | 10/2017 |
| JP | 2017183427 A * | 10/2017 |
| WO | WO 2015/193763 A1 | 12/2015 |

* cited by examiner

LIGHT-EMITTING DEVICE

CROSS-REFERENCE TO RELATED APPLICATION

This application claims priority to Japanese Patent Application No. 2017-131056 filed on Jul. 4, 2017, and Japanese Patent Application No. 2018-096537 filed on May 18, 2018, the disclosures of which are hereby incorporated by reference in their entirety.

BACKGROUND

The present disclosure relates to a light-emitting device.

White light-emitting devices employing combinations of light-emitting elements and phosphors have been brought into wide use recently. For example, Japanese Unexamined Patent Application Publication No. 2013-120812 discloses a light-emitting device in which a first encapsulating material containing a yellow phosphor covers blue LED chips and a red light-emitting unit constituted by covering a near-ultraviolet LED chip with a material containing a red phosphor (see FIG. 9 and the third embodiment in Japanese Unexamined Patent Application Publication No. 2013-120812). According to the Patent Publication No. 2013-120812, the light-emitting device in this Patent Publication has improved color mixing and reduced in the color non-uniformity of the emitted light.

However, there is a demand for light-emitting devices having further improved color mixing and further reduced color non-uniformity of the emitted light in recent years.

Accordingly, the present disclosure has an object to provide a light-emitting device having further improved color mixing and further reduced color non-uniformity of the emitted light.

SUMMARY

A light-emitting device according to certain embodiment of the present disclosure includes: a base member; a plurality of first light-emitting elements disposed on the base member; a plurality of second light-emitting elements disposed on the base member; a plurality of first wavelength conversion members; and a second wavelength conversion member. The first wavelength conversion members are respectively disposed on or above the first light-emitting elements. The first wavelength conversion members each comprises a light-transmissive body mainly containing an inorganic material, and a first phosphor layer on the lower surface of the light-transmissive body. The second wavelength conversion member is disposed on the base member to cover the second light-emitting elements and the first wavelength conversion members. The second wavelength conversion member comprises an encapsulating resin and second phosphor.

The light-emitting device according to certain embodiment of the present disclosure has further improved color mixing and further reduced color non-uniformity of the emitted light.

DETAILED DESCRIPTION OF EMBODIMENTS

The following describes a light-emitting device according to embodiments.

The light-emitting device to be described below is intended to embody the technical concept of the present disclosure and does not limit the present disclosure to the device below unless specifically stated otherwise.

Embodiment 1

Figure 1:
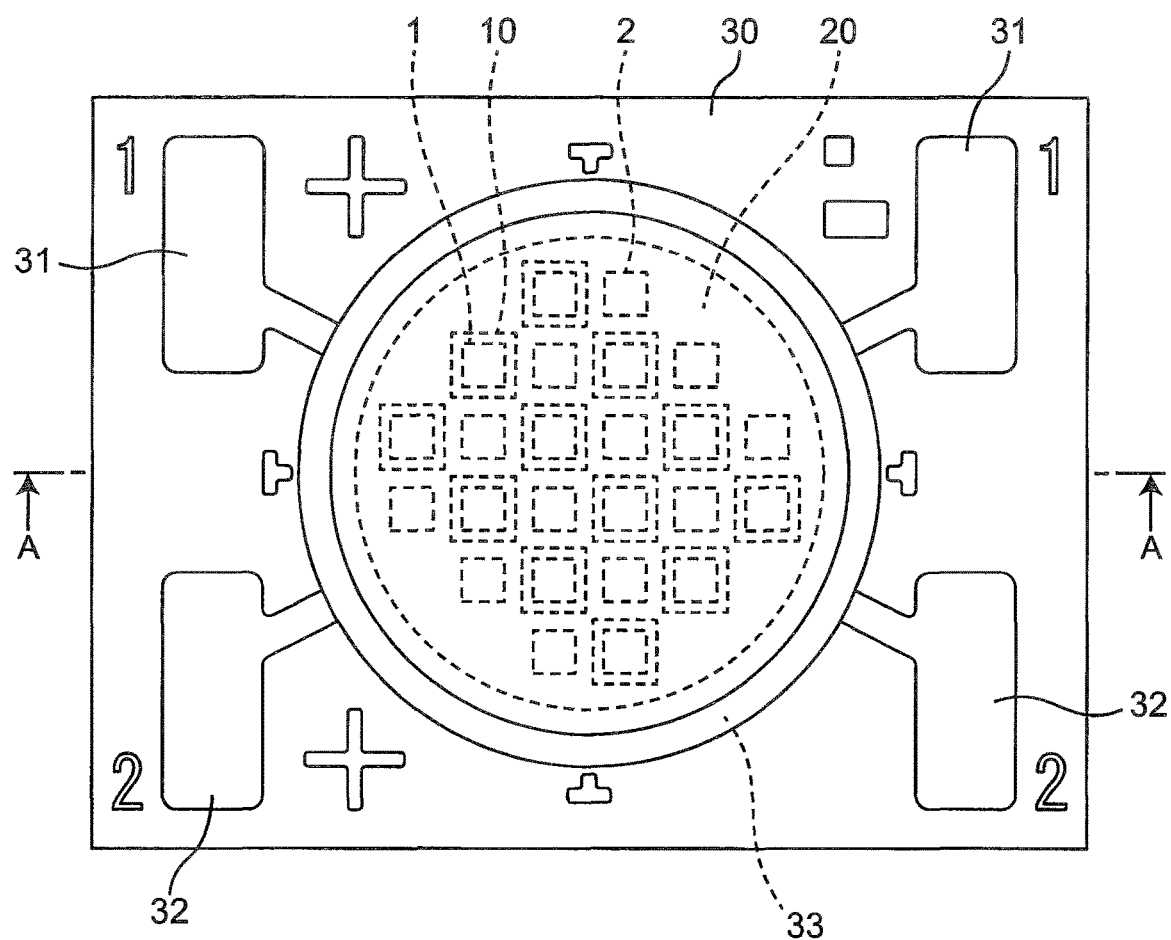
FIG. 1 is a schematic top view of a light-emitting device according to Embodiment 1.
Figure 2:
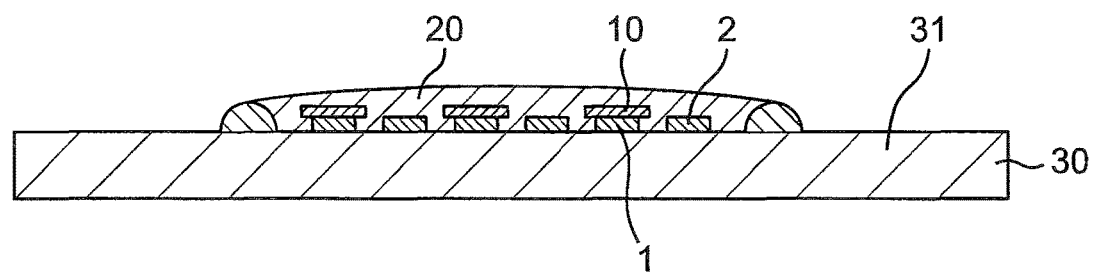
FIG. 2 is a schematic sectional view taken along the line A-A in FIG. 1.

As shown in FIG. 1 and FIG. 2, the light-emitting device according to Embodiment 1 includes a base member 30, a plurality of first light-emitting elements 1 disposed on the base member 30, a plurality of second light-emitting elements 2 disposed on the base member 30, first wavelength conversion members 10 respectively disposed on or above the first light-emitting elements 1, and a second wavelength conversion member 20 disposed on the base member 30 that integrally covers the second light-emitting elements 2, the first light-emitting elements 1, and the first wavelength conversion members 10.

In the light-emitting device according to Embodiment 1, the base member 30 is, for example, a substrate having a flat upper surface. Wiring through which electricity is supplied to the first light-emitting elements 1 and the second light-emitting elements 2, is disposed on the upper surface of the base member 30. The wiring disposed on the upper surface of the base member 30 includes first wiring 31 through which electricity is supplied to the first light-emitting elements 1, and second wiring 32 through which electricity is supplied to the second light-emitting elements 2. A frame 33 is disposed on the upper surface of the base member 30 so as to surround a mounting region in which the first light-emitting elements 1 and the second light-emitting elements 2 are mounted. The first light-emitting elements 1 and the second light-emitting elements 2 are arranged as follows in the mounting region inside the frame 33 on the upper surface of the base member 30.

In the light-emitting device according to Embodiment 1, the first light-emitting elements 1 and the second light-emitting elements 2 each have a polygonal planar shape such as a substantially rectangular shape in a top view. The first light-emitting elements 1 or the second light-emitting elements 2 are arranged such that, for example, their centers coincide with lattice points in a rectangular lattice. In other words, the light-emitting elements are arranged along a direction substantially parallel to one pair of opposite sides of the rectangular lattice and along a direction substantially parallel to the other pair of opposite sides among the two pairs of opposite sides. In the present specification, a line of light-emitting elements arranged along a direction substantially parallel to one pair of opposite sides of the rectangular lattice is referred to as a row, and a line of light-emitting elements arranged along a direction substantially parallel to the other pair of opposite sides is referred to as a column. In the light-emitting device according to Embodiment 1, the first light-emitting elements 1 and the second light-emitting elements 2 are arranged in rows or columns, and the first light-emitting elements 1 and the second light-emitting elements 2 are alternately arranged in each row or column. In this manner, four second light-emitting elements 2 are disposed adjacently around a first light-emitting element 1, and four first light-emitting elements 1 are disposed adjacently around a second light-emitting element 2. In the present specification, the term "substantially rectangular" for describing "a light-emitting element having a substantially rectangular planar shape" may include a tolerance of about 90°±5° angle in the four corners. In addition, the term "substantially polygonal" for describing "a light-emitting element having a substantially polygonal planar shape" may include a tolerance of about ±5° on each corner. In the present specification, the term "substantially parallel" may include a tolerance of deviations from parallelism of about ±5°.

In the light-emitting device according to Embodiment 1, in terms of the circuit configuration, the first light-emitting elements 1 are arranged along, for example, the diagonal directions of the rectangular lattice in which the light-emitting elements are arranged. The same applies to the second light-emitting elements 2. Specifically, the first light-emitting elements 1 are arranged in odd-numbered columns along a diagonal direction, and the second light-emitting elements 2 are arranged in even-numbered columns along the diagonal direction. In other words, the columns of the first light-emitting elements along the diagonal direction and the columns of the second light-emitting elements along the diagonal direction are alternately arranged. Although there are two diagonal directions, the odd-numbered columns and the even-numbered columns along a diagonal direction in the present specification are columns along a diagonal direction in which adjacent first light-emitting elements 1 are connected, or along a diagonal direction in which adjacent second light-emitting elements 2 are connected.

This arrangement of the first light-emitting elements 1 and the second light-emitting elements 2 can realize improved color mixing and reduction in color non-uniformity of the light-emitting device according to Embodiment 1. In addition, the following structure further enhances the color mixing and reduction in color non-uniformity.

The following describes the light-emitting device according to the present embodiment in detail.

Figure 3:
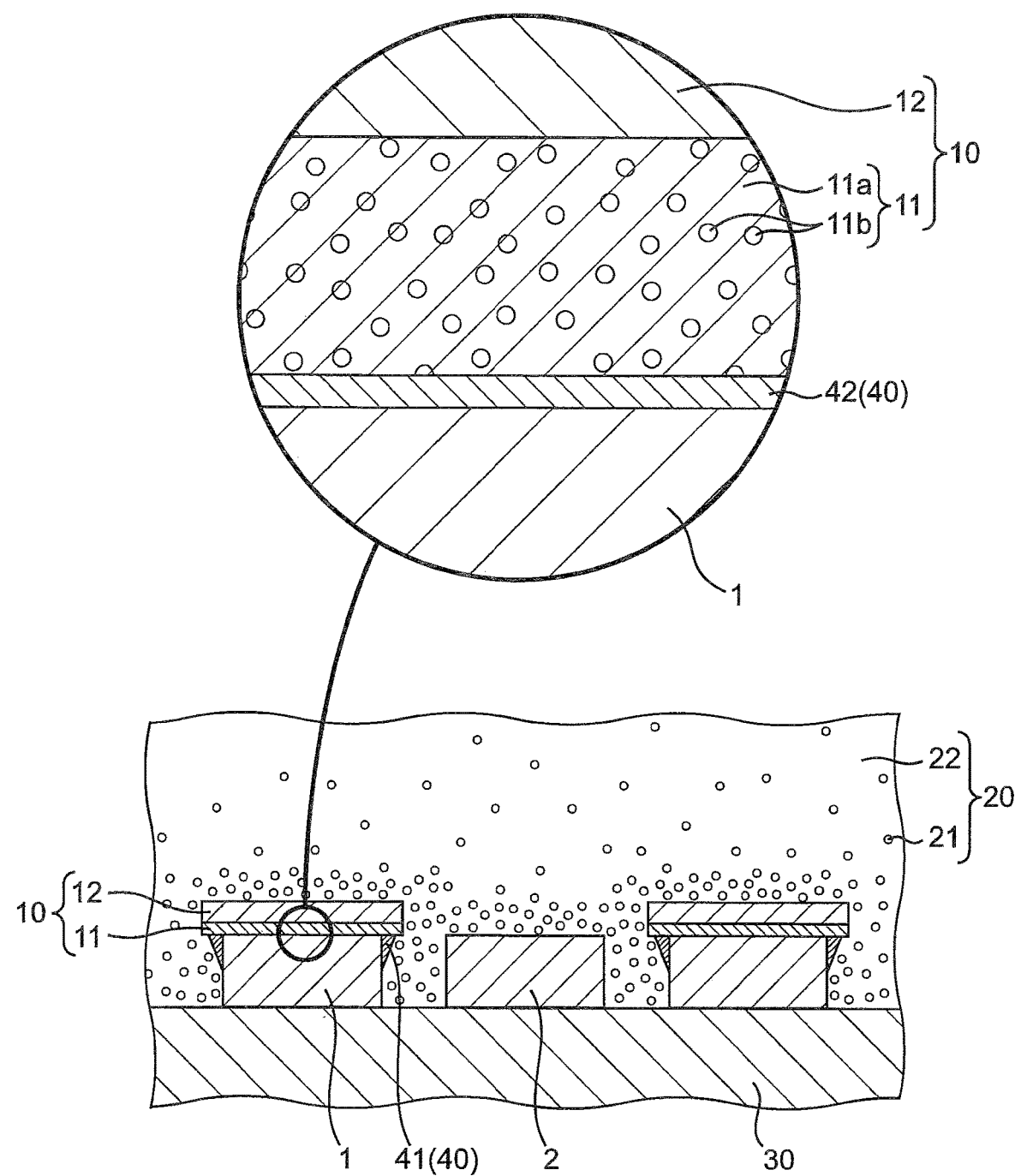
FIG. 3 is a schematic enlarged sectional view of part of FIG. 2.

First, as shown in FIG. 3, the first wavelength conversion members 10 each include a light-transmissive body 12 and a first phosphor layer 11. The light-transmissive body 12 have an upper surface and a lower surface, and contains an inorganic material. The first phosphor layer 11 is disposed on the lower surface of the light-transmissive body 12. The first wavelength conversion members 10 are respectively disposed on or above the first light-emitting elements 1 such that the first phosphor layer 11 faces the light emission surface of the corresponding first light-emitting element 1. The first phosphor layer 11 contains, for example, a light-transmissive resin 11a and first phosphor 11b dispersed in the light-transmissive resin 11a. The second wavelength conversion member 20 contains, for example, an encapsulating resin 22 having light-transmissivity and second phosphor 21 dispersed in the encapsulating resin 22.

The first phosphor 11b is excited by first light emitted from the first light-emitting elements 1 to emit light that differs in wavelengths from the first light. The second phosphor 21 is excited by second light emitted from the second light-emitting elements 2 to emit light that differs in wavelengths from the second light. The second phosphor 21 may be excited by the first light emitted from the first light-emitting elements 1 to emit light that differs in wavelengths from the first and second light.

In the light-emitting device according to Embodiment 1 having the above structure include first light-emitting portions and second light-emitting portions. The first light-emitting portions are each configured with the first light-emitting elements 1 and the first phosphor 11b. The second light-emitting portions are configured with the second light-emitting elements 2 and the second phosphor 21. In the case where the second phosphor 21 is excitable by the first light, the second phosphor 21 is also included in the first light-emitting portions.

In the light-emitting device according to Embodiment 1 having the above structure, light from the first light-emitting portions including the first light-emitting elements 1 and light from the second light-emitting portions including the second light-emitting elements 2 are mixed together (i.e., color mixing), whereby the mixed light having a desired emission color is emitted from the upper surface of the encapsulating resin 22. In other words, in the light-emitting device according to Embodiment 1, the first light emitted from the first light-emitting elements 1, the second light emitted from the second light-emitting elements 2, light emitted from the first phosphor 11b, and light emitted from the second phosphor 21 are mixed together within the encapsulating resin 22 that integrally covers the second light-emitting elements 2, the first light-emitting elements 1, and the first wavelength conversion members 10, whereby the mixed light having a desired emission color is emitted from the upper surface of the encapsulating resin 22.

The base member 30 of the light-emitting device according to Embodiment 1 includes the first wiring 31 through which electricity is supplied to the first light-emitting elements 1 and the second wiring 32 through which electricity is supplied to the second light-emitting elements 2. This structure enables electricity supply to the first light-emitting elements 1 and electricity supply to the second light-emitting elements 2 to be separately controlled. The emission colors are different between the first light-emitting portions and the second light-emitting portions, and the current values applied to the first wiring 31 and the second wiring 32 are controlled. Accordingly, the emission color of the light-emitting device can be changed. This point will be described later in detail.

In the light-emitting device according to Embodiment 1 having the above structure, the first wavelength conversion members 10 each include the light-transmissive body 12 formed using an inorganic material, and the encapsulating resin 22 covers the first wavelength conversion members 10 each including the light-transmissive body 12. In this structure, the boundaries between the inorganic material and the resin, that is, the lateral surfaces of the light-transmissive body 12, function as light-scattering surfaces resulting in improvement of the color mixing within the encapsulating resin 22, thereby effectively reducing color non-uniformity of light emitted from the upper surface of the encapsulating resin 22.

For example, in general, refractive indices of inorganic materials widely vary depending on the types of materials compared to resins, and the material for the light-transmissive body 12 can be selected from materials having various refractive indices. Hence, it is possible to make the difference in refractive index between the inorganic material constituting the light-transmissive body 12 and the encapsulating resin 22 large, thereby enhancing the reflectance of the lateral surfaces of the light-transmissive body 12. To produce the first wavelength conversion members 10, in many cases, form a phosphor layer on one main surface of a large-sized light-transmissive body, and then cut the workpiece into individual first wavelength conversion members 10. The cut surfaces, that is, the lateral surfaces of the first wavelength conversion members 10, are usually rough surfaces, which have a high scattering function.

The light-emitting device according to Embodiment 1 includes the first wavelength conversion members 10 that each include the light-transmissive body 12 formed using an inorganic material, and the encapsulating resin 22 that covers the first wavelength conversion members 10 each including the light-transmissive body 12 Accordingly, the light-emitting device of Embodiment 1 can realize further improvement of color mixing within the encapsulating resin 22, and reduction in color non-uniformity of light emitted from the upper surface of the encapsulating resin 22.

In the light-emitting device according to Embodiment 1, the refractive index of the light-transmissive body 12 is preferably larger than the refraction of the encapsulating resin 22. This structure can make the angle of refraction of light emitted from the upper surface of the light-transmissive body 12 larger than the angle of incidence of light passing through inside the light-transmissive body 12 and entering the encapsulating resin 22. Then, the first light passing through the light-transmissive body 12 and light emitted from the first phosphor 11b are emitted and spread from the upper surface of the light-transmissive body 12 (i.e., surface opposite to the surface on which the first phosphor layer 11 is formed), thereby further improving the color mixing.

Each of the first wavelength conversion members 10 is bonded to the corresponding first light-emitting element 1 with, for example, a bonding member 40. In this case, it is preferable that the bonding member 40 form a fillet 41 covering at least part of the lateral surfaces of the first light-emitting element 1, and that the fillet 41 contain a light-reflective filler. If the fillet 41 contains a light-reflective filler, light emitted from the lateral surfaces of the second light-emitting elements 2 can be reflected by the fillet 41 to be able to utilize it as excitation light for the second phosphor 21, thereby enhancing the wavelength conversion efficiency. Also, if the bonding member 40 forms the fillet 41 containing a light-reflective filler, the fillet 41 scatters light by reflection and further improves the color mixing. A bonding member 42 between the first wavelength conversion member 10 and the first light-emitting element 1 excluding the fillet 41 is preferably as thin as practical bonding strength can be maintained.

The second wavelength conversion member 20 contains, for example, the encapsulating resin 22 having light-transmissivity and the second phosphor 21 dispersed in the encapsulating resin 22. Particles of the second phosphor 21 are preferably localized around the first light-emitting elements 1 and the second light-emitting elements 2 within the encapsulating resin 22. For example, the particles of the second phosphor 21 can be localized around the first light-emitting elements 1 and the second light-emitting elements 2 by sedimentation within the encapsulating resin 22 in the manufacturing process. This can realize the thickness of the portion in which the particles of the second phosphor s 21 are localized becomes substantially uniform, and the optical path length of light passing through the portion with a high density of the phosphors of the second phosphor 21 becomes constant, thereby mitigating color non-uniformity and appearance of the yellow ring.

The first phosphor 11b contained in the first phosphor layer 11 preferably includes two or more types of phosphors with different emission colors. The same applies to the second phosphor 21 contained in the second wavelength conversion member 20. A desired emission color can be easily obtained by appropriately selecting two or more types of phosphors with different emission colors for the first phosphor 11b contained in the first phosphor layer 11, appropriately selecting the content of each type of the phosphors, appropriately selecting two or more types of phosphors with different emission colors for the second phosphor 21 contained in the second wavelength conversion member 20, and appropriately selecting the content of each type of the phosphors. For example, the first phosphor layer 11 may contain first red phosphor and first green phosphor, and the second wavelength conversion member 20 may contain second red phosphor and second green phosphor, to thereby easily realize a desired emission color on the blackbody locus.

In this case, the first red phosphor and the second red phosphor may be the same phosphor material, or may be different phosphor materials. Also, the first green phosphor and the second green phosphor may be the same phosphor material, or may be different phosphor materials. As an example, the first red phosphor and the second red phosphor are the same phosphor material, and the first green phosphor and the second green phosphor are the same phosphor material. In this case, even when the emission color of the light-emitting device is changed by, for example, controlling the current values applied to the first wiring 31 and the second wiring 32, variances in color rendering properties can be reduced.

The following describes the circuit configuration of the light-emitting device according to Embodiment 1.

As described above, the base member 30 includes the first wiring 31 through which electricity is supplied to the first light-emitting elements 1 and the second wiring 32 through which electricity is supplied to the second light-emitting elements 2, both disposed on the upper surface of thereon.

Figure 4:
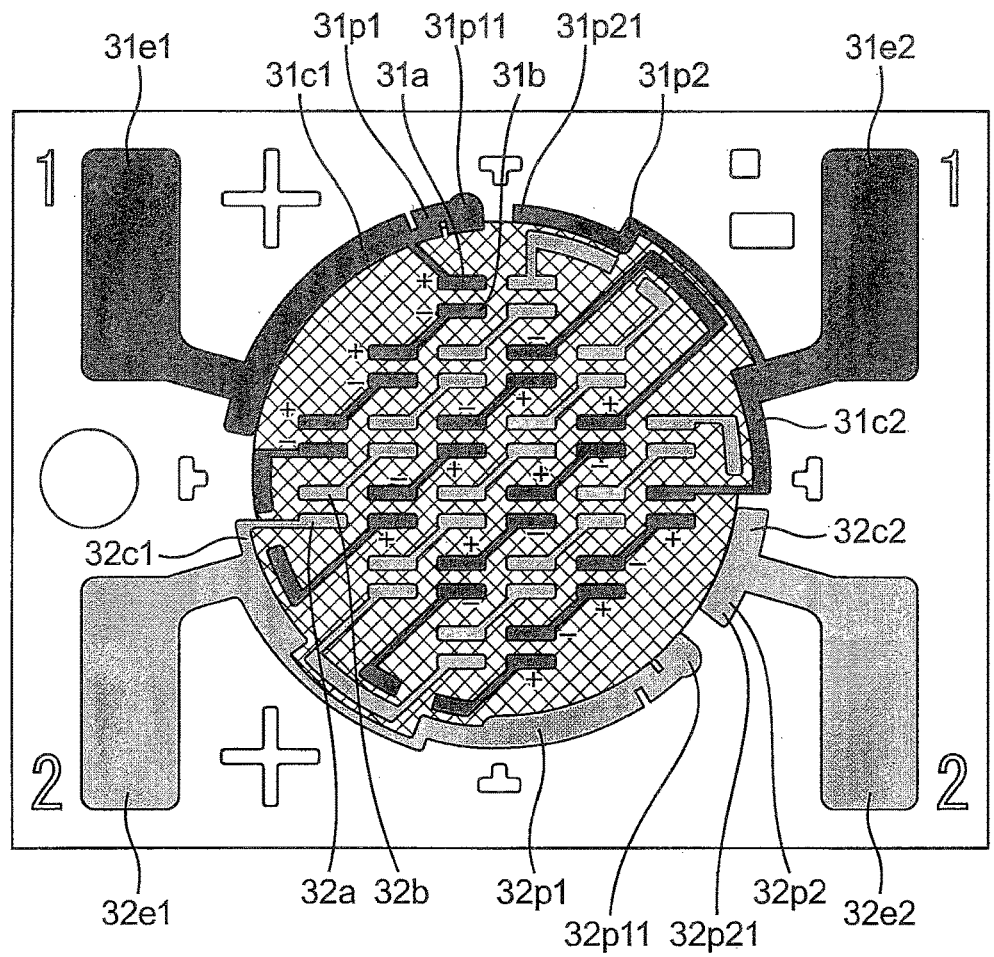
FIG. 4 is a schematic top view of a base member 30 according to Embodiment 1.

As shown in FIG. 4, the first wiring 31 includes first p-side lands 31a to be respectively connected to p-side electrodes of the first light-emitting elements 1, and first n-side lands 31b to be respectively connected to n-side electrodes of the first light-emitting elements 1, both to be mounted in the mounting region inside the frame 33. The portion of the first wiring 31 inside the mounting region is referred to as first inner wiring. The first wiring 31 also includes a first external connecting land 31e1 on the positive side and a first external connecting land 31e2 on the negative side, both outside the frame 33. The first wiring 31 further includes first connecting wiring 31c1 connecting the first external connecting land 31e1 to the beginning point of the first inner wiring, and first connecting wiring 31c2 connecting the first external connecting land 31e2 to the end point of the first inner wiring. In the first inner wiring, except for the first p-side land 31a directly connected to the first connecting wiring 31c1 and the first n-side land 31b directly connected to the first connecting wiring 31c2, the first n-side lands 31b are connected to the first p-side lands 31a via wiring or wires formed on the upper surface of the base member as shown in FIG. 4 so that the first light-emitting elements 1 are connected in series between the first external connecting land 31e1 and the first external connecting land 31e2 when the first light-emitting elements 1 are connected. The first wiring 31 also includes a first protective-element connecting wiring 31p1 and 31p2. The first protective-element connecting wiring 31p1 extends from the portion of the first connecting wiring 31c1 connected to the beginning point of the first inner wiring toward the direction opposite to the first external connecting land 31e1. The first protective-element connecting wiring 31p2 extends from the portion of the first connecting wiring 31c2 connected to the end point of the first inner wiring toward the direction opposite to the first external connecting land 31e2. An end of the first protective-element connecting wiring 31p1 is referred to as a protective-element connecting wiring 31p11. An end of the first protective-element connecting wiring 31p2 is referred to as a protection-element connecting wiring 31p21.

Also, the second wiring 32 includes second p-side lands 32a and second n-side lands 32b in the mounting region inside the frame 33. The second p-side lands 32a are respectively connected to p-side electrodes of the second light-emitting elements 2 to be mounted in the mounting region inside the frame 33. The second n-side lands 32b are respectively connected to n-side electrodes of the second light-emitting elements 2 to be mounted in the mounting region inside the frame 33. The portion of the second wiring 32 inside the mounting region is referred to as second inner wiring. The second wiring 32 includes a second external connecting land 32e1 on the positive side and a second external connecting land 32e2 on the negative side, both outside the frame 33. The second wiring 32 includes second connecting wiring 32c1 connecting the second external connecting land 32e1 to the beginning point of the second inner wiring, and second connecting wiring 32c2 connecting the second external connecting land 32e2 to the end point of the second inner wiring. In the second inner wiring, except for the second p-side land 32a directly connected to the second connecting wiring 32c1 and the second n-side land 32b directly connected to the second connecting wiring 32c2, the second n-side lands 32b are connected to the second p-side lands 32a via wiring or wires formed on the upper surface of the base member as shown in FIG. 4 so that the second light-emitting elements 2 are connected in series between the second external connecting land 32e1 and the second external connecting land 32e2 when the second light-emitting elements 2 are connected. The second wiring 32 also includes a second protective-element connecting wiring 32p land 32p2. The second protection-element connecting wiring 32p1 extends from the portion of the second connecting wiring 32c1 connected to the beginning point of the second inner wiring toward the direction opposite to the second external connecting land 32e1. The second protective-element connecting wiring 32p2 extends from the portion of the second connecting wiring 32c2 connected to the end point of the second inner wiring toward the direction opposite to the second external connecting land 32e2. An end of the second protective-element connecting wiring 32p1 is referred to as a protective-element connecting wiring 32p11. An end of the second protective-element connecting wiring 32p2 is referred to as a protection-element connecting wiring 32p21.

Figure 5:
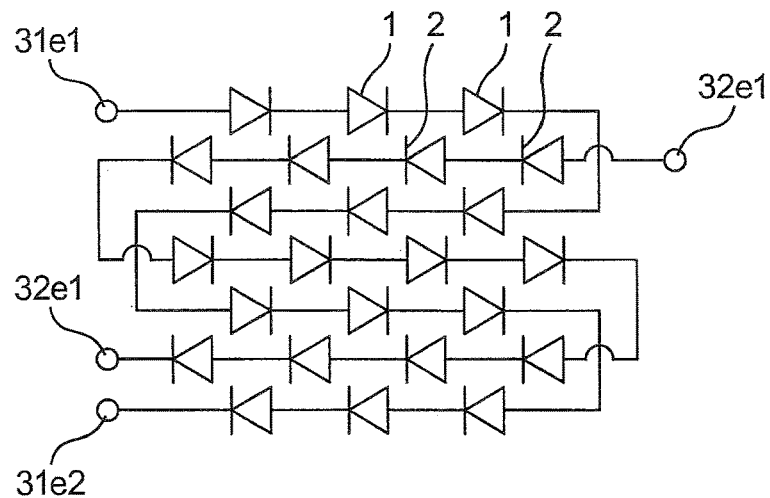
FIG. 5 is a circuit configuration diagram of first light-emitting elements and second light-emitting elements in the light-emitting device according to Embodiment 1.

The first light-emitting elements 1 are connected to the respective first p-side lands 31a and first n-side lands 31b of the first wiring 31 as described above, whereby the first light-emitting elements 1 are connected in series between the first external connecting land 31e1 on the positive side and the first external connecting land 31e2 on the negative side as shown in FIG. 5.

A protective element can be connected in parallel with the series circuit (first series circuit) containing the first light-emitting elements 1 connected in series as appropriate by mounting the protective element on the first protective-element mounting portion 31p1, connecting the cathode of the protective element to the first protective-element mounting portion 31p1, and connecting the anode of the protective element to the first protective-element connecting wiring 31p2.

The second light-emitting elements 2 are connected to the respective second p-side lands 32a and second n-side lands 32b of the second wiring 32, whereby the second light-emitting elements 2 are connected in series between the second external connecting land 32e1 on the positive side and the second external connecting land 32e2 on the negative side as shown in FIG. 5.

If needed, a protective element can be connected in parallel with the series circuit (i.e., second series circuit) in which the second light-emitting elements 2 are connected in series by mounting the protective element on the second protective-element mounting portion 32p1, connecting the cathode electrode of the protective element to the second protective-element mounting portion 32p1, and connecting the anode electrode of the protective element to the second protective-element connecting wiring 32p2.

The emission color of the light-emitting device as a whole can be changed (i.e., color control) by controlling each of the current values applied to the first series circuit in which the first light-emitting elements 1 are connected in series, and applied to the second series circuit in which the second light-emitting elements 2 are connected in series, as described above.

In the above-described example of the light-emitting device according to Embodiment 1, all the first light-emitting elements 1 are connected in series between the external connecting land 31e1 and the first external connecting land 31e2, and all the second light-emitting elements 2 are connected in series between the second external connecting land 32e1 and the second external connecting land 32e2. However, the light-emitting device according to Embodiment 1 is not limited to this structure. For example, it is also possible to split the first light-emitting elements 1 into a plurality of groups and the second light-emitting elements 2 into a plurality of groups. Each group of first light-emitting elements 1 or second light-emitting elements 2 can be connected in series, and each series circuit connected in series can be connected to the external connecting land 31e1 and the first external connecting land 31e2, or to the second external connecting land 32e1 and the second external connecting land 32e2, in parallel.

For example, the light-emitting device can have a structure that includes blue light-emitting elements for both of the first light-emitting elements 1 and the second light-emitting elements 2, and the first phosphor layer 11 and the second wavelength conversion member 20. Each of the first phosphor layer 11 and the second wavelength conversion member 20 contains the same red phosphor and green phosphor both excited by blue light. In this light-emitting device, the red phosphor and the green phosphor contained in the second wavelength conversion member 20 are present above the first light-emitting elements 1 in addition to the red phosphor and the green phosphor contained in the first phosphor layer 11. Therefore, light emitted from the first light-emitting portions including the first light-emitting elements 1 has a low color temperature according to this light-emitting device. On the other hand, light emitted from the second light-emitting portions including the second light-emitting elements 2 has a high color temperature because substantially only the red phosphor and the green phosphor contained in the second wavelength conversion member 20 are present above the second light-emitting elements 2. Accordingly, this illustrative light-emitting device can provide light having a low color temperature if the current value applied to the first series circuit connecting the first light-emitting elements 1 connected in series is larger than the current value applied to the second series circuit connecting the second light-emitting elements 2 connected in series. Alternatively, light having a high color temperature can be realized if the current value applied to the first series circuit is smaller than the current value applied to the second series circuit. The light intensity of the light-emitting device can be changed by changing both of the current value applied to the first series circuit and the current value applied to the second series circuit without changing the ratio between the both current values, which does not change the emission color.

Also, the light-emitting device according to Embodiment 1 having a structure that includes blue light-emitting elements for both of the first light-emitting elements 1 and the second light-emitting elements 2, and the first phosphor layer 11 and the second wavelength conversion member 20, each of which contains the same red phosphor and green phosphor both excited by blue light. In such a case, light emitted from the first light-emitting portions including the first light-emitting elements 1 can have about 2700K of color temperature, and the light emitted from the second light-emitting portions including the second light-emitting elements 2 can have about 6500K of color temperature. Accordingly, Embodiment 1 can provide the light-emitting device capable shifting color temperature in a range of from 2700K to 6500K of the color temperature of its light emission.

Embodiment 2

A light-emitting device according to Embodiment 2 is different to Embodiment 1 in that (a) a frame 53 has an octagonal shape in a top view, and (b) a part of a first wiring and a part of a second wiring each have a different shape to those of Embodiment 1 by having the shape of the frame 53. The light-emitting device according to Embodiment 2 has a same structure as the light-emitting device according to Embodiment 1 except for the above (a) and (b). The following describes part of the light-emitting device of Embodiment 2 different from the light-emitting device of Embodiment 1 in details, and description of the same part of the light-emitting devices thereof is omitted.

Figure 6:
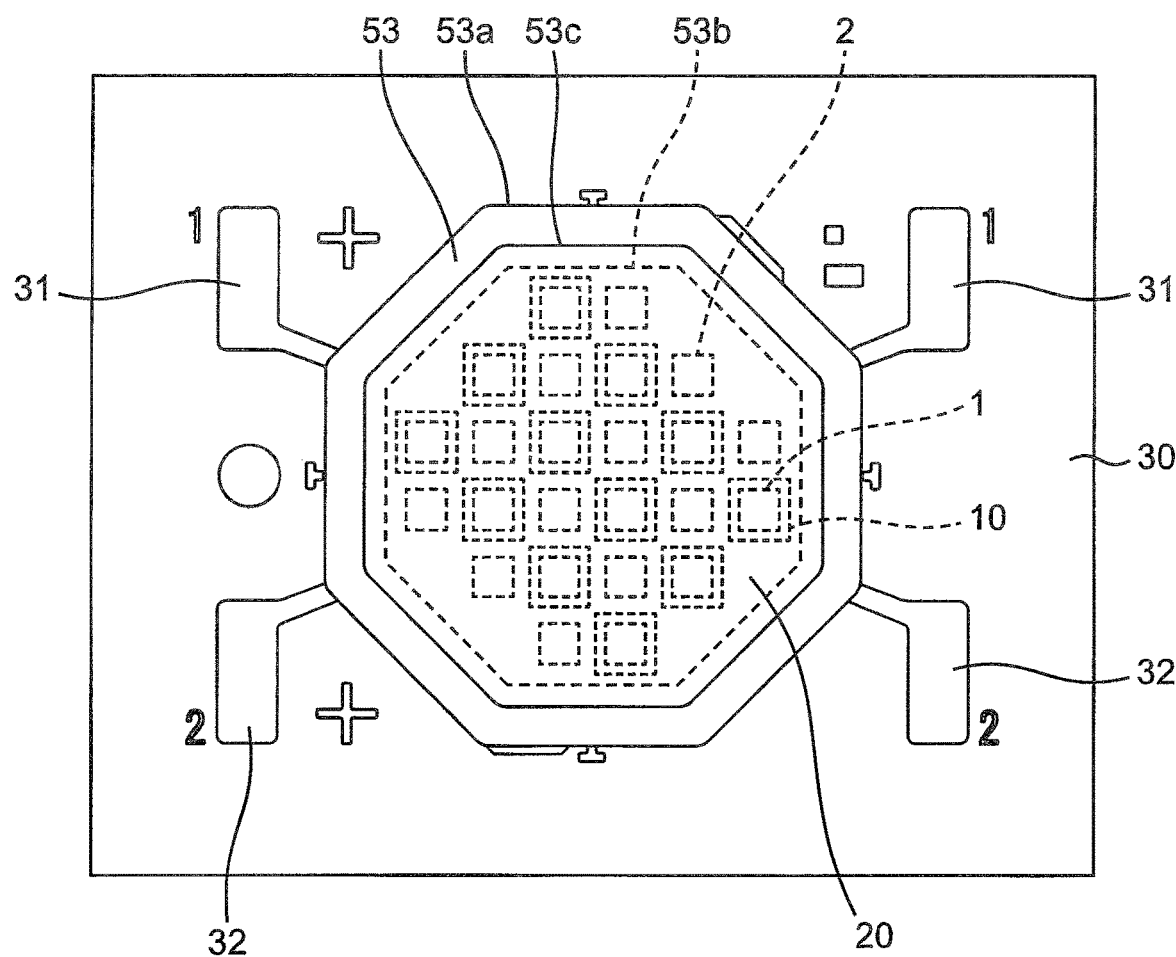
FIG. 6 is a schematic top view of a light-emitting device according to Embodiment 2.

As shown in FIG. 6, the light-emitting device according to Embodiment 2 includes the frame 53 having the octagonal shape in a top view, as described above. In other words, an outer edge lower end 53a and an inner edge lower end 53b on the top surface of the base member 30 each have an octagonal shape. A boundary 53c between the frame 53 and a second wavelength conversion member 20 has an octagonal shape on a surface of the frame 53. In the light-emitting device according to Embodiment 2, a surface of the second wavelength conversion member 20 inside the boundary 53c serves as a light emission surface of the light-emitting device.

Figure 7:
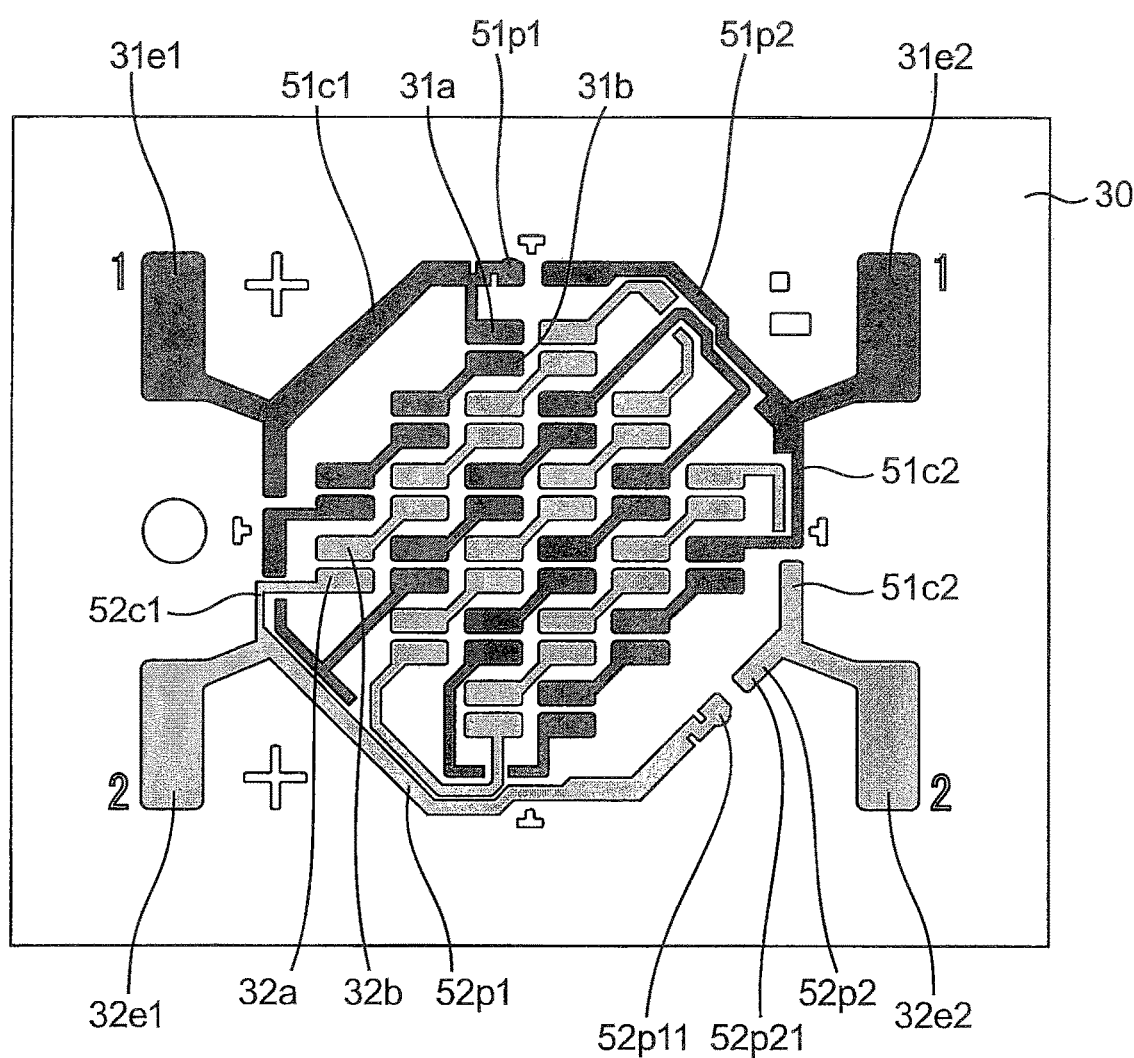
FIG. 7 is a schematic top view of a base member 30 according to Embodiment 2.

By virtue of the frame 53 having the octagonal shape, the part of the first wiring and the part of the second wiring, that is, the part of the first wiring embedded in the frame 53 and the part of the second wiring embedded in the frame 53 each have a shape different to the light-emitting device of Embodiment 1. Specifically, as shown in FIG. 7, first connecting wiring 51c1, 51c2, first protective-element connecting wiring 51p1, 51p2, second connecting wiring 52c1, 51c2, and second protective-element connecting wiring 52p1, 52p2 are provided between the outer edge lower end 53a and the inner edge lower end 53b so as to be parallel to the outer edge lower end 53a and the inner edge lower end 53b. The first connecting wiring 51c1, 51c2, the first protective-element connecting wiring 51p1, 51p2, and the second protective-element connecting wiring 52p1, 52p2 are embedded in the frame 53 having the octagonal shape, and are bent at corners of the frame 53.

In the light-emitting device according to Embodiment 2 having the above structure, the first light-emitting devices 1 and the first wavelength-conversion member 10 are disposed along the inner edge lower end of the frame 53, and the second light-emitting device 2 are disposed along the inner edge lower end of the frame 53. This structure can make intervals between the first light-emitting elements 1 or the first wavelength-conversion member 10 and the inner edge lower end 53b smaller, and make intervals between the second light-emitting elements 2 and the inner edge lower end 53b. The frame 33 in the light-emitting device according to Embodiment 1 has a circular shape. In the case where the light-emitting devices are arranged such that their centers respectively coincide with lattice points in a rectangular lattice, part of the intervals becomes large in order to ensure certain distances between the respective light-emitting elements arranged along the outer perimeter and the inner edge lower end of the frame 33. On the other hand, the frame 53 in the light-emitting device according to Embodiment 2 has the octagonal shape. Therefore, in the case where the light-emitting elements are arranged such that their centers respectively coincide with lattice points in a rectangular lattice, the intervals can be equal distance between the respective light-emitting elements arranged along the outer perimeter and the inner edge lower end of the frame 33. Accordingly, the intervals between some of the light-emitting elements and the inner edge lower end 53b is less likely to become large. The light-emitting device according to Embodiment 2 can have a light emission surface smaller than that of the light-emitting device according to Embodiment 1.

Due to having the small light emission surface, the light-emitting device according to Embodiment 2 can have a high luminous flux density even when employing the same type and number of the light-emitting elements. For example, in a lighting fixture for lighting apparatus or the like, in which the light-emitting device according to Embodiment 2 is used, light from the light-emitting device can be efficiently utilized. In other words, it is possible to improve efficiency of taking light from the light emitting device according to Embodiment 2 into the lighting fixture. Also, the light-emitting device according to Embodiment 2 can have a high luminous flux density, whereby, for example, it is possible to improve the light focusing in a lighting fixture incorporating the light-emitting device according to Embodiment 2.

As described above, in the light-emitting device according to Embodiment 2, the intervals between the light-emitting elements along the inner edge lower end 53b and the inner edge lower end 53b can be the same. This can mitigate possible color non-uniformity in a periphery of the light emission surface that may be caused by increase of the intervals between some of the light-emitting element and the inner edge lower end 53b. Accordingly color non-uniformity on the light-emitting device according to Embodiment 2 can be efficiently mitigated.

Although FIG. 6 shows the light-emitting device according to Embodiment 2 in which the frame 53 has a regular octagonal shape in a top view, the shape of the frame 53 in the light-emitting device according to Embodiment 2 is not limited to a regular octagon in a top view. The frame 53, for example, may have an octagonal shape in a top view in which length of sides inclined at an angle of 45° in a row or column direction become longer than length of sides in the row or column direction, in consideration of the arrangement of the light-emitting elements. With this structure, the intervals between the light-emitting elements arranged along the inner edge lower end 53b and the inner edge lower end 53b can be constant.

The following describes the structure and its components in Embodiment 1.

First Phosphor and Second Phosphor

The first and second phosphor (hereinafter also referred to as phosphor) include phosphor materials that can be excited by at least part of light emitted from the light-emitting elements to emit light with wavelengths different from the emission wavelength of the light-emitting elements.

For example, in the case where blue light-emitting elements are used for the first light-emitting elements 1 and the second light-emitting elements 2, emission of white light can be achieved by employing a yellow phosphor material that is excited by blue light to emit yellow light and a red phosphor material that is excited by blue light to emit red light, as the phosphor materials.

Specific examples of the phosphor materials include the followings. Examples of yellow to green phosphors include yttrium-aluminum-garnet phosphors (YAG phosphors) and lutetium-aluminum-garnet phosphors (LAG phosphors). Examples of green phosphors include chlorosilicate phosphors and β-SiAlON phosphors. Examples of red phosphors include SCASN phosphors such as $(Sr,Ca)AlSiN_3$:Eu, CASN phosphors such as $CaAlSiN_3$:Eu, $SrAlSiN_3$:Eu phosphors, and KSF phosphors such as $K_2SiF_6$:Mn.

For example, in the case where blue light-emitting elements are used for the first light-emitting elements 1 and the second light-emitting elements 2, where two types of phosphors including a YAG phosphor and a SCASN phosphor are used for the first phosphor, and where a YAG phosphor is used for the second phosphor, the color temperature of light from the first light-emitting portions including the first light-emitting elements 1 is about 2700K, and the color temperature of light from the second light-emitting portions including the second light-emitting elements 2 is about 6500K, so that the resulting light-emitting device can emit light having a color temperature of about 2700K to 6500K as a result of mixing of these colors. Such a light-emitting device can be used for a lighting application.

Phosphor Layer

The first phosphor layer 11 can be formed by, for example, mixing the phosphor and a binder mainly containing a light-transmissive material such as resins, glass, and inorganic substances, and forming the mixture on the surface of the light-transmissive body 12. The first phosphor layer 11 may be a single layer containing one type of phosphor or may be a single layer containing two or more types of phosphors. Alternatively, the first phosphor layer 11 may include a layer containing one type of phosphor and a layer containing the same phosphor or a different type of phosphors. The first phosphor layer 11 may contain a diffusing material as appropriate. The first phosphor layer 11 is preferably larger in area than the upper surface of each first light-emitting element 1. In this case, the first phosphor layer 11 is preferably disposed on or above the first light-emitting element 1 such that the surface of the first phosphor layer 11 is annularly exposed around the upper surface of the light-emitting element.

The first phosphor layer 11 is formed on the surface of the light-transmissive body 12, for example, by printing. The first phosphor layer 11 in the present embodiment covers not only the case where the phosphor layer is in direct contact with the surface of the light-transmissive body 12, but also the case where the phosphor layer is bonded with another member such as an adhesive therebetween. The first phosphor layer 11 is bonded to the surface of the light-transmissive body 12 by, for example, compression, fusion bonding, sintering, bonding with an organic adhesive, and bonding with an inorganic adhesive such as low-melting-point glass. In addition to printing, examples of the method for forming the first phosphor layer 11 include compression molding, phosphor electrodeposition, and a method using a phosphor sheet. In printing, a paste containing a phosphor, a binder, and a solvent is prepared, applied to the surface of the light-transmissive body, and dried, so that the phosphor layer is formed. Examples of binder include an organic resin binder such as epoxy resins, silicone resins, phenolic resins, and polyimide resins or an inorganic binder such as glass. In compression molding, the material for the phosphor layer containing a phosphor and a binder is formed with a mold on the surface of the light-transmissive body. In phosphor electrodeposition, an electrically-conductive thin film that can be light-transmissive is formed on the surface of the light-transmissive body in advance, and a charged phosphor is then allowed to deposit on the thin film using electrophoresis. In the method using a phosphor sheet, a phosphor sheet made by mixing and kneading a phosphor with a silicone resin and forming the mixture into a sheet is used. The thickness of the phosphor sheet is not limited as long as the thickness is small, but the thickness is about 200 μm or less in view of improvement in heat dissipation from the phosphor. The phosphor sheet is compressed and integrated with the light-transmissive body.

The thickness of the first phosphor layer 11 is, for example, 0.2 times to 1.5 times, preferably 0.5 times to 1 times, the thickness of the light-transmissive body. The thickness of the first phosphor layer 11 is preferably 35 μm to 200 μm, more preferably 80 μm to 150 μm. If the thickness of the first phosphor layer 11 is larger than 200 μm, its heat dissipation tends to be low. Smaller thicknesses of the phosphor layer is more preferable in view of the heat dissipation, but a too thin phosphor layer contains less phosphor and tends to narrow down the desired chromaticity range of emitted light. This point is also taken into account when adjustment to an appropriate thickness is carried out.

Light-Transmissive Body

The light-transmissive body 12 is a member prepared separately from the phosphor layer containing the phosphor and supports the first phosphor layer 11 formed on the surface of the light-transmissive body 12. A plate-shaped body formed using an inorganic material such as glass can be used for the light-transmissive body 4. The glass can be selected from, for example, borosilicate glass and quartz glass. The light-transmissive body 4 is thick enough to mitigate decrease in its mechanical strength in the manufacturing process, and to impart sufficient mechanical strength to the phosphor layer 3. The outline of the light-transmissive body 12 is preferably larger than the outline of the light-emitting element. This structure can ensure that the phosphor layer is disposed on or above the entire upper surface of the light-emitting element even in the case where some misalignment is occur in mounting when the phosphor layer is formed on the entire main surface of the light-transmissive body and placed so as to face the upper surface of the light-emitting element. The light-transmissive body 12 may contain a diffusing material. This can mitigate color non-uniformity that may occur when the concentration of the phosphor in the first phosphor layer 11 is reduced. Examples of the diffusing material include titanium oxide, barium titanate, aluminum oxide, and silicon oxide. The lateral surfaces of the light-transmissive body 12 are preferably rough surfaces. If the lateral surfaces of the light-transmissive body 12 are rough surfaces, that is, if the lateral surfaces of the light-transmissive body 12 have irregularities, the lateral surfaces can scatter, for example, light from the second light-emitting elements 2, improve the color mixing performance, and effectively mitigate color non-uniformity of the light-emitting device as a whole. In this case, if the light-transmissive body 12 contains the diffusing material, color non-uniformity of the light-emitting device as a whole can be more effectively mitigated. In addition, the upper surface, which serves as the light emission surface, of the light-transmissive body 4 is not limited to a flat surface but may have minute irregularities. This structure can promote scattering of light emitted from the light emission surface, and enables further mitigation of luminance non-uniformity and color.

Bonding Member

The bonding member 40 is required to be light-transmissivity so as to be able to effectively guide light emitted from the first light-emitting element 1 to the first phosphor layer 11. Specific examples of the bonding member 40 having light-transmissivity include organic resins such as epoxy resins, silicone resins, phenolic resins, and polyimide resins. Silicone resins are preferable. The bonding member 42 between the first light-emitting element 1 and the first phosphor layer 11 is preferably as thin as possible. Making the bonding member 42 thin improves the heat dissipation and reduces loss of light transmission, thereby enhancing the light-emission efficiency of the light-emitting device.

The bonding member 40 is preferably present not only between the first light-emitting element 1 and the first phosphor layer 11 but also on the lateral surfaces of the first light-emitting element 1 to form the fillet 41. The fillet 41 can reflect light emitted from the lateral surfaces of the first light-emitting element 1, and allows the light to enter the first phosphor layer 11, thereby improving the wavelength conversion efficiency of the first phosphor layer 11. In addition, reflection of light emitted from the second light-emitting elements 2 by the fillet 41 contributes to improvement in the color mixing as described above. The fillet here means a portion having a triangular sectional shape that is tapered from the light-emitting element toward the lower direction. The fillet 41 can be formed by adjusting the amount of the bonding member used to bond the first light-emitting element 1 to the first phosphor layer 11. In the case where a silicone resin is used for a binder of the first phosphor layer 11, it is preferable that a silicone resin be also employed for the bonding member 40. This structure can reduce the difference in refractive index between the first phosphor layer 11 and the bonding member 40, and thus can increase light that enters the first phosphor layer 11.

Encapsulating Resin

The encapsulating resin 22 is preferably formed of an electrically insulating material that can transmit light emitted from the light-emitting elements and has fluidity before being cured. A light-transmissive resin having a light transmittance of 70% or more is preferably selected for the encapsulating resin. Examples of the light-transmissive resin include silicone resins, modified silicone resins, epoxy resins, phenolic resins, polycarbonate resins, acrylic resins, TPX, polynorbornene resins, and hybrid resins each containing one or more of the above resins. Among these resins, silicone resins is preferable due to good heat and light resistance and low volume shrinkage after being cured.

The encapsulating resin 22 may further contain additives such as fillers and diffusing materials in addition to the second phosphor. Examples of the diffusing materials include $SiO_2$ and $TiO_2$.

Base Member

The base member 30 is a component on which the first light-emitting elements 1, the second light-emitting elements 2, and, as appropriate, the protective elements are disposed. The base member 30 is provided with the first wiring 31, the second wiring 32, and the frame 33 on the upper surface of the base member 30. For example, the base member 30 is formed into a rectangular flat plate as shown in FIG. 1 and FIG. 2 The size of the base member 30 is appropriately selected depending on the number of light-emitting elements to be disposed, the purpose, and the intended use.

An insulating material that is less likely to transmit light emitted from the light-emitting elements and light from outside is preferably used as the material for the base member 30.

Specific examples of the material include ceramics such as $Al_2O_3$ and AlN, and resins such as phenolic resins, epoxy resins, polyimide resins, BT resins, and polyphthalamide (PPA). A reflective member may be disposed on the surface on which the light-emitting elements are to be mounted to enhance light reflection. The reflective member is made by, for example, mixing and kneading reflective particles such as $TiO2$ and an organic or inorganic binder Examples of the reflective member include so-called white resist, white inks, and ceramic inks. A silicone resin, which has good heat and light resistance, is particularly preferably used for the organic binder. This structure allows light to be reflected by the surface of the base member, thereby enabling improvement of the light extraction efficiency of the light-emitting device.

First Wiring and Second Wiring

As described above, the first wiring and the second wiring (hereinafter simply referred to as wiring) are electrically connected to the light-emitting elements disposed and the protective elements disposed as appropriate on the base member, and are used to apply voltage from an external power supply. The wiring is formed using, for example, a metal member, the material for which is not particularly limited. For example, in the case where the base member 30 is formed using a ceramic, examples of the material for the wiring include metal materials and alloys each containing W, Mo, Ti, Ni, Au, Cu, Ag, Pd, Rh, Pt, or Sn as a main component. The wiring can be plated by vapor deposition, sputtering, printing, or the like. A metal material containing Au as a main component is preferably formed on the outermost surface of the wiring by plating or the like, in view of mitigation of deterioration and adhesion with bonding members. The thickness of the wiring is not particularly limited and is appropriately selected in consideration of the number of the light-emitting elements to be mounted and electric power to be supplied.

The first wiring 31 and the second wiring 32 are formed on the upper surface of the base member 30, therefore, separate portions of the first wiring 31 can be connected to each other across the second wiring 32 using a wire as appropriate, or separate portions of the second wiring 32 can be connected to each other across the first wiring 31.

First and Second Light-Emitting Elements

The first light-emitting elements 1 and the second light-emitting elements 2 (hereinafter also referred to as light-emitting elements) are semiconductor elements that emit light when voltage is applied.

The light-emitting elements may each have, for example, a substantially rectangular shape as shown in FIG. 1 and other drawings, or another polygonal shape such as a substantially hexagonal shape, in a plan view. The emission wavelength of each light-emitting element is appropriately selected in consideration of the intended use, the excitation wavelength of the first phosphor 11b contained in the first phosphor layer 11, the excitation wavelength of the second phosphor 21 contained in the second wavelength conversion member 20, and other conditions. For example, ZnSe, a nitride semiconductor, or GaP can be employed for a blue (in a wavelength range of from 430 nm to 490 nm) or green (in a wavelength range of from 490 nm to 570 nm) light-emitting element. GaAlAs, AlInGaP, or the like can be employed for a red (in a wavelength range of from 620 nm to 750 nm) light-emitting element. In the case where a white light-emitting device is made as the light-emitting device according to the embodiments, for example, blue light-emitting elements in which a nitride semiconductor is used, are preferably used. The light-emitting elements are not limited to elements that emit visible light, and elements that emit ultraviolet or infrared rays can be selected.

The first light-emitting elements 1 and the second light-emitting elements 2 may be light-emitting elements with the same emission wavelength or may be light-emitting elements, for example, with different emission wavelengths.

Although the number of the first light-emitting elements 1 is the same as the number of the second light-emitting elements 2 in the above example of the light-emitting device according to the embodiments, this structure does not limit the light-emitting device according to the embodiments, and the number of the first light-emitting elements 1 may differ from the number of the second light-emitting elements 2. Generally, the lower the color temperature is, the lower the light-emission efficiency becomes in the case where LEDs are used as light-emitting elements. Hence, in the case where, for example, the color temperature of light from the second light-emitting portions is lower than the color temperature of light from the first light-emitting portions, the balance between the brightnesses or the light-emission efficiencies may be adjusted by making the number of the first light-emitting elements 1 greater than the number of the second light-emitting elements 2. Alternatively, in the case where the emission color is to be changed (color control) in a minute lighting region, by reducing the number of elements that are not required to be bright, the number of the other elements can be increased. The brightness and the light-emission efficiency of the light-emitting device can be thus improved.

Frame

The frame 33 is preferably made of, for example, a mixture of an insulating resin and a light-reflective member. For example, a thermosetting resin or a thermoplastic resin can be used for the insulating resin. More specific examples include phenolic resins, epoxy resins, BT resin, PPA, and silicone resins. In the case where a device that does not emit light is mounted on the substrate, the device is preferably embedded in a light-reflective resin so as not to absorb light. An example of the device that does not emit light is a protective element. The frame 33 can be formed by, for example, drawing with the resin discharged from a dispenser, printing, transfer molding, or compression molding.

The frame is formed so as to surround the second wavelength conversion member. The frame reduces variances in the shape of the second wavelength conversion member in a top view in the case where the second wavelength conversion member is formed by applying. That is, in the case where uncured material of the second wavelength conversion member is applied inside the frame, uncured material of the second wavelength conversion member flows inside the frame, but the frame surrounding the second wavelength conversion member prevents the second wavelength conversion member from flowing out of the frame. This can mitigate variance in the shape of the second wavelength conversion member in a top view.

What is claimed is:

1. A light-emitting device comprising:
a base member;
a plurality of first light-emitting elements disposed on the base member;
a plurality of second light-emitting elements disposed on the base member;
a plurality of first wavelength conversion members respectively disposed on or above the first light-emitting elements, the first wavelength conversion members each comprising:
a light-transmissive body having an upper surface and a lower surface and comprising an inorganic material; and
a first phosphor layer on the lower surface of the light-transmissive body;
a second wavelength conversion member disposed on the base member to cover the second light-emitting elements and the first wavelength conversion members, the second wavelength conversion member comprising:
an encapsulating resin; and
second phosphor; and
a frame surrounding the second wavelength conversion member,
wherein at least one pair of the first light-emitting element and the second light-emitting element that are adjacent to each other is arranged on an outermost side so as to face the frame,
wherein edges of a frame side of the at least one pair of the first light-emitting element and the second light-emitting element are in parallel with an inner edge lower end of the frame in a top view,
wherein the first wavelength conversion members are respectively bonded to the first light-emitting elements with bonding members,
wherein the bonding members each comprises a fillet covering at least part of a lateral surface of the first light-emitting element,
wherein the fillet comprises a light-reflective filler,
wherein the base member comprises a first wiring and a second wiring separated from each other,
wherein the first light-emitting elements are connected to the first wiring, and
wherein the second light-emitting elements are connected to the second wiring.

2. The light-emitting device according to claim 1, wherein the second phosphor is localized around a first light-emitting element and a second light-emitting element within the encapsulating resin.

3. The light-emitting device according to claim 1,
wherein the first phosphor layer of the first wavelength conversion member comprises a first red phosphor and a first green phosphor, and wherein the second phosphor in the second wavelength conversion member comprises a second red phosphor and a second green phosphor.

4. The light-emitting device according to claim 3, wherein the first red phosphor and the second red phosphor comprise a same phosphor material, and
wherein the first green phosphor and the second green phosphor comprise a same phosphor material.

5. The light-emitting device according to claim 1, wherein the first light-emitting elements are connected in series via the first wiring, and
wherein the second light-emitting elements are connected in series via the second wiring.

6. The light-emitting device according to claim 1, wherein the first light-emitting elements and the second light-emitting elements are arranged in rows and columns, and
wherein the first light-emitting elements and the second light-emitting elements are alternately arranged in each of the rows and the columns.

7. The light-emitting device according to claim 5, wherein the first light-emitting elements and the second light-emitting elements each have a substantially rectangular shape,
wherein the first light-emitting elements and the second light-emitting elements are arranged along a diagonal direction of the substantially rectangular shape, and
wherein a first light-emitting element column along the diagonal direction and a second light-emitting element column along the diagonal direction are alternately arranged.

8. The light-emitting device according to claim 1, wherein a refractive index of the light-transmissive body is larger than a reflective index of the encapsulating resin.

9. The light-emitting device according to claim 1, wherein a thickness of the phosphor layer is 0.2 times to 1.5 times as large as a thickness of the light-transmissive body.

10. The light-emitting device according to claim 1, wherein a thickness of the phosphor layer is 35 μm to 200 μm.

11. The light-emitting device according to claim 1, wherein an outer edge lower end and the inner edge lower end of the frame have an octagonal shape in the top view.

12. The light-emitting device according to claim 1, wherein the edges of the frame side of the at least one pair of the first light-emitting element and the second light-emitting element and the inner edge lower end of the frame are located on a same straight line in the top view.

13. The light-emitting device according to claim 1, wherein a number of the first light-emitting elements is equal to a number of the second light-emitting elements.

14. The light-emitting device according to claim 1, wherein lateral surfaces of the first wavelength conversion members are rough surfaces.

15. The light-emitting device according to claim 1, wherein the light-transmissive body has a rectangular shape in a cross-sectional view.

16. A light-emitting device comprising:
a base member;
a plurality of first light-emitting elements disposed on the base member;
a plurality of second light-emitting elements disposed on the base member;
a plurality of first wavelength conversion members respectively disposed on or above the first light-emitting elements, the first wavelength conversion members each comprising:
a light-transmissive body having an upper surface and a lower surface and comprising an inorganic material; and
a first phosphor layer on the lower surface of the light-transmissive body;
a second wavelength conversion member disposed on the base member to cover the second light-emitting elements and the first wavelength conversion members, the second wavelength conversion member comprising:
an encapsulating resin; and
second phosphor; and
a frame surrounding the second wavelength conversion member,
wherein at least one pair of the first light-emitting element and the second light-emitting element that are adjacent to each other is arranged on an outermost side so as to face the frame,
wherein edges of a frame side of the at least one pair of the first light-emitting element and the second light-emitting element are in parallel with an inner edge lower end of the frame in a top view,
wherein the first phosphor layer of the first wavelength conversion members comprises a first red phosphor and a first green phosphor,
wherein the second phosphor in the second wavelength conversion member comprises a second red phosphor and a second green phosphor,
wherein the base member comprises a first wiring and a second wiring separated from each other,
wherein the first light-emitting elements are connected to the first wiring, and
wherein the second light-emitting elements are connected to the second wiring.

17. A light-emitting device comprising:
a base member;
a plurality of first light-emitting elements disposed on the base member;
a plurality of second light-emitting elements disposed on the base member;
a plurality of first wavelength conversion members respectively disposed on or above the first light-emitting elements, the first wavelength conversion members each comprising:
a light-transmissive body having an upper surface and a lower surface and comprising an inorganic material; and
a first phosphor layer on the lower surface of the light-transmissive body;
a second wavelength conversion member disposed on the base member to cover the second light-emitting elements and the first wavelength conversion members, the second wavelength conversion member comprising:
an encapsulating resin; and
second phosphor; and
a frame surrounding the second wavelength conversion member,
wherein at least one pair of the first light-emitting element and the second light-emitting element that are adjacent to each other is arranged on an outermost side so as to face the frame,
wherein edges of a frame side of the at least one pair of the first light-emitting element and the second light-emitting element are in parallel with an inner edge lower end of the frame in a top view, wherein the base member comprises a first wiring and a second wiring separated from each other, wherein the first light-emitting elements are connected to the first wiring, wherein the second light-emitting elements are connected to the second wiring, and wherein an outer edge lower end and the inner edge lower end of the frame have an octagonal shape in the top view.

18. The light-emitting device according to claim 16, wherein the second phosphor is localized around a first light-emitting element and a second light-emitting element within the encapsulating resin.

19. The light-emitting device according to claim 16, wherein the first light-emitting elements are connected in series via the first wiring, wherein the second light-emitting elements are connected in series via the second wiring, wherein the first light-emitting elements and the second light-emitting elements each have a substantially rectangular shape, wherein the first light-emitting elements and the second light-emitting elements are arranged along a diagonal direction of the substantially rectangular shape, and wherein a first light-emitting element column along the diagonal direction and a second light-emitting element column along the diagonal direction are alternately arranged.

20. The light-emitting device according to claim 17, wherein the second phosphor is localized around a first light-emitting element and a second light-emitting element within the encapsulating resin.

\* \* \* \* \*